US012784866B2

(12) United States Patent
Sim

(10) Patent No.: US 12,784,866 B2
(45) Date of Patent: Nov. 3, 2026

(54) APPARATUS AND METHOD FOR DIAGNOSING MEMORY

(71) Applicant: Samsung SDI Co., Ltd., Yongin-si (KR)

(72) Inventor: Se Sub Sim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 16 days.

(21) Appl. No.: 18/810,956

(22) Filed: Aug. 21, 2024

(65) Prior Publication Data

US 2025/0364071 A1 Nov. 27, 2025

(30) Foreign Application Priority Data

May 22, 2024 (KR) ........................ 10-2024-0066402

(51) Int. Cl.
*G11C 29/56* (2006.01)
*G11C 29/02* (2006.01)

(52) U.S. Cl.
CPC ........ *G11C 29/56012* (2013.01); *G11C 29/02* (2013.01); *G11C 29/56008* (2013.01)

(58) Field of Classification Search
None
See application file for complete search history.

(56) References Cited

U.S. PATENT DOCUMENTS 5,644,539 A 7/1997 Yamagami et al.
9,569,120 B2 * 2/2017 Ryan ...................... G11C 16/26
10,599,753 B1 * 3/2020 Eisner .................. G06F 40/197
2004/0015674 A1 * 1/2004 Lakhani ................. G11C 29/76 711/E12.008
2010/0011261 A1 * 1/2010 Cagno ................. G06F 11/1064 714/719
2012/0284453 A1 11/2012 Hashimoto
2013/0232289 A1 * 9/2013 Zhong ................ G11C 16/3495 711/102
2020/0241802 A1 7/2020 Kanno
2021/0126946 A1 * 4/2021 Chou .................... H04L 9/3073

OTHER PUBLICATIONS

Extended European Search Report dated Apr. 15, 2025, in connection with European Application No. 24211646.5.

* cited by examiner

*Primary Examiner* — Khoa D Doan
(74) *Attorney, Agent, or Firm* — Wolf, Greenfield & Sacks, P.C.

(57) ABSTRACT

The present disclosure relates to an apparatus and method for diagnosing deterioration of a memory, and is directed to providing an apparatus and method for diagnosing a memory, the apparatus capable of diagnosing a degree of deterioration of a memory among circuit components constituting a battery pack, and predicting and managing a lifespan of the memory based on the diagnosis result. The present disclosure provides a configuration that calculates a state of health (SOH) of the memory based on one or more of an erase count of data written to the memory, an erase time required to erase the data written to the memory, a write error count when writing the data to the memory, and a write time required to write the data to a memory cell, and determines the remaining lifespan according to the SOH.

19 Claims, 7 Drawing Sheets

APPARATUS AND METHOD FOR DIAGNOSING MEMORY

CROSS-REFERENCE TO RELATED APPLICATIONS

This present application claims priority to and the benefit under 35 U.S.C § 119(a)-(d) of Korean Patent Application No. 10-2024-0066402, filed on May 22, 2024, in the Korean Intellectual Property Office, the entire disclosure of which is incorporated herein by reference.

FIELD

Aspects of embodiments of the present disclosure relate to an apparatus and method for diagnosing a memory.

BACKGROUND

The European Union (EU) Battery Regulation, which came into effect on Feb. 18, 2024, requires that battery packs for industrial, light means of transport (LMT), and electric vehicle (EV) use should support reuse and recycling, and end-users should be able to easily remove and replace components of the battery pack such as individual battery cells. The EU Battery Regulation also requires that software applied to the battery pack should not interfere with the replacement of key components, but there is no separate guidance on the battery pack protection operation when components are replaced and the lifespan of a circuit configuration related to a battery management system (BMS) that calculates a state (SoX) of the battery.

The above information disclosed in this Background section is for enhancement of understanding of the background of the present disclosure, and therefore, it may contain information that does not constitute related (or prior) art.

SUMMARY

The present techniques are directed to providing an apparatus and method for diagnosing the deterioration of a memory, capable of diagnosing a degree of deterioration of a memory among circuit components constituting a battery pack, and predicting and managing a lifespan of the memory based on the diagnosis result.

However, objects that the present techniques intend to achieve are not limited to the above-described objects and other objects that are not described may be clearly understood by those skilled in the art from the following description.

According to an aspect of the present disclosure, there is provided an apparatus for diagnosing a memory, and a processor that operates to write data to the memory or erase data written to the memory, wherein the processor diagnoses a deterioration of the memory based on one or more of an erase count of the data written to the memory, an erase time required to erase the data written to the memory, and a write error count when writing data to the memory.

The processor may be configured to calculate a first state of health (SOH), a second SOH, and a third SOH of the memory based on the erase count, the erase time, and the write error count, and may be configured to calculate a final SOH of the memory based on a size of each of the calculated first to third SOHs.

The processor may be configured to calculate the first SOH using a ratio between the erase count and a predefined allowable erase count.

A plurality of SOH ranges may be predefined according to a set step, and the processor may be configured to calculate the second SOH by a method of determining a reference SOH of the memory corresponding to the erase time, specifying a target SOH range to which the reference SOH belongs among the plurality of SOH ranges, and applying a weight to the reference SOH based on the number of times the target SOH range is specified.

The weight may be differentially determined according to a ratio between the number of times the target SOH range is specified and a reference value mapped to the target SOH range.

When the ratio between the number of times the target SOH range is specified and the reference value mapped to the target SOH range is less than a set ratio: the weight may be determined by multiplying (i) the ratio between the number of times the target SOH range is specified and the reference value mapped to the target SOH range and (ii) the set step, and the processor may calculate the second SOH by subtracting the weight from the reference SOH.

When the ratio between the number of times the target SOH range is specified and the reference value mapped to the target SOH range is greater than or equal to a set ratio: the weight may be determined as a set margin value, and the processor may calculate the second SOH by adding the set margin value to a lower limit SOH of the target SOH range.

The reference SOH may be determined to have a lower value as the erase time increases.

The processor may be configured to calculate the third SOH using a ratio between the write error count and a predefined allowable error count.

The processor may be configured to calculate a minimum value among the first to third SOHs as the final SOH of the memory.

The processor may be configured to diagnose the deterioration of the memory by further considering a write time required to write the data to the memory.

The processor may be configured to calculate a fourth SOH and a fifth SOH of the memory based on the write time and the write error count, and may calculate a final SOH of the memory based on a size of each of the calculated fourth and fifth SOHs.

A plurality of SOH ranges may be predefined according to a set step, and the processor may be configured to calculate the fourth SOH by a method of determining a reference SOH of the memory corresponding to the write time, specifying a target SOH range to which the reference SOH belongs among the plurality of SOH ranges, and applying a weight to the reference SOH based on the number of times the target SOH range is specified.

The memory may include a flash memory, and when an error occurs when writing data to the flash memory, the processor may unconditionally block subsequent writing of data to an address at which the error occurs.

The memory may include an electrically erasable programmable read-only memory (EEPROM), and when an error occurs when writing data to the EEPROM, the processor may be allocated a spare address converted from an address at which the error occurs, and the processor may perform a data write operation using the allocated spare address.

The processor may transmit a deterioration diagnosis result for the memory to an external device only when a currently received request for transmission of diagnostic information is authenticated by a predefined authentication key.

According to aspects of the present disclosure, there is provided an apparatus for diagnosing a memory, the apparatus including: a memory including: a memory cell, and a memory controller that is configured to write data to the memory cell or erase data written to the memory cell; and a higher-level controller configured to control an operation of the memory and determine an operating state according to a control result, wherein the higher-level controller may be configured to diagnose a deterioration of the memory based on one or more of an erase count of the data written to the memory cell, an erase time required to erase the data written to the memory cell, a write error count when writing the data to the memory cell, and a write time required to write the data to the memory cell, which may be identified based on a result of determining the operating state of the memory.

The higher-level controller may be configured to transmit a command directing erasing or writing of the data to the memory cell to the memory controller and may be configured to determine the operating state of the memory based on an interrupt generated by the memory controller.

The higher-level controller may be implemented as a battery management system (BMS), and the memory and the BMS may constitute a battery pack.

According to aspects of the present disclosure, there is provided a method of diagnosing deterioration of a memory including a memory cell and a memory controller configured to write data to the memory cell or erase the data written to the memory cell, the method including: transmitting, by the higher-level controller, a command to control an operation of the memory to the memory controller; determining, by the higher-level controller, an operating state of the memory based on an interrupt generated by the memory controller; and diagnosing, by the higher-level controller, the deterioration of the memory based on one or more of an erase count of the data written to the memory cell, an erase time required to erase the data written to the memory cell, a write error count when writing the data to the memory cell, and a write time required to write the data to the memory cell, which may be identified based on a result of determining the operating state of the memory.

BRIEF DESCRIPTION OF THE DRAWINGS

The following drawings accompanying this specification illustrate embodiments of the present disclosure, and further describe aspects and features of the present disclosure together with the detailed description of the present disclosure. Thus, the present disclosure should not be construed as being limited to the drawings.

DETAILED DESCRIPTION

Figure 1:
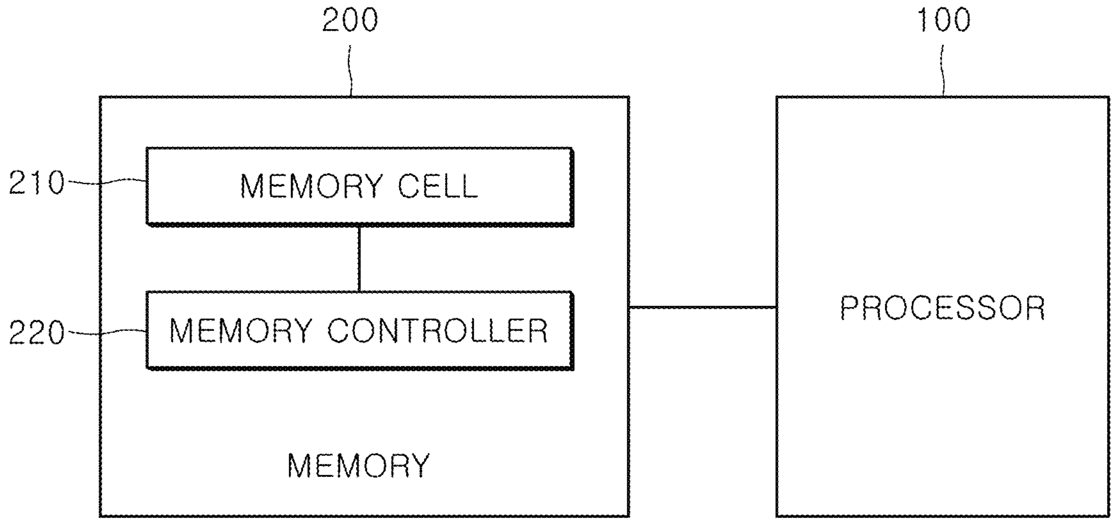
FIG. 1 is a block diagram of an apparatus for diagnosing a memory according to some embodiments of the present disclosure.

Hereinafter, embodiments of the present disclosure will be described, in detail, with reference to the accompanying drawings. The terms or words used in the specification and claims should not be construed as being limited to the usual or dictionary meaning and should be interpreted as meaning and concept consistent with the technical idea of the present disclosure based on the principle that the inventor can be his/her own lexicographer to appropriately define the concept of the term to explain his/her invention in the most suitable way.

The embodiments described in this specification and the configurations shown in the drawings are only some of the embodiments of the present disclosure and do not represent all of the technical ideas, aspects, and features of the present disclosure. Accordingly, it should be understood that there may be various equivalents and modifications that can replace or modify the embodiments described herein at the time of filing this application.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. When phrases such as "at least one of A, B and C, "at least one of A, B or C," "at least one selected from a group of A, B and C," or "at least one selected from among A, B and C" are used to designate a list of elements A, B and C, the phrase may refer to any and all suitable combinations or a subset of A, B and C, such as A, B, C, A and B, A and C, B and C, or A and B and C. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

References to two compared elements, features, etc. as being "the same" may mean that they are "substantially the same". Thus, the phrase "substantially the same" may include a case having a deviation that is considered low in the art, for example, a deviation of 5% or less. In addition, when a certain parameter is referred to as being uniform in a given region, it may mean that it is uniform in terms of an average.

Throughout the specification, unless otherwise stated, each element may be singular or plural.

When an arbitrary element is referred to as being disposed (or located or positioned) on the "above (or below)" or "on (or under)" a component, it may mean that the arbitrary element is placed in contact with the upper (or lower) surface of the component and may also mean that another component may be interposed between the component and any arbitrary element disposed (or located or positioned) on (or under) the component.

In addition, it will be understood that when an element is referred to as being "coupled," "linked" or "connected" to another element, the elements may be directly "coupled," "linked" or "connected" to each other, or an intervening element may be present therebetween, through which the element may be "coupled," "linked" or "connected" to another element. In addition, when a part is referred to as being "electrically coupled" to another part, the part can be directly connected to another part or an intervening part may be present therebetween such that the part and another part are indirectly connected to each other.

Throughout the specification, when "A and/or B" is stated, it means A, B or A and B, unless otherwise stated. That is, "and/or" includes any or all combinations of a plurality of items enumerated. When "C to D" is stated, it means C or more and D or less, unless otherwise specified.

A BMS and a memory mounted on a battery pack can be subject to large variations in the component deterioration state depending on usage environment and history, making it difficult to predict remaining lifespans thereof. Lifespans of components in a finished battery pack can be significantly longer than a design lifespan of the battery pack, and thus, managing the lifespans of the components has not been a primary design consideration, but when a battery cell, which can be a key component of the battery pack, is replaced for reuse and recycling, the lifespan of the battery pack also increases rapidly, and thus, there is an emerging need to predict and manage the remaining lifespans of circuit components such as the BMS and the memory, which are non-replaced components inside the battery pack.

However, the lifespans of circuit components in the battery pack, such as the BMS and the memory, are currently managed on a "paper-based" aspect, such as the date of manufacture, and there is a lack of quantitative lifespan management methods.

Figure 2:
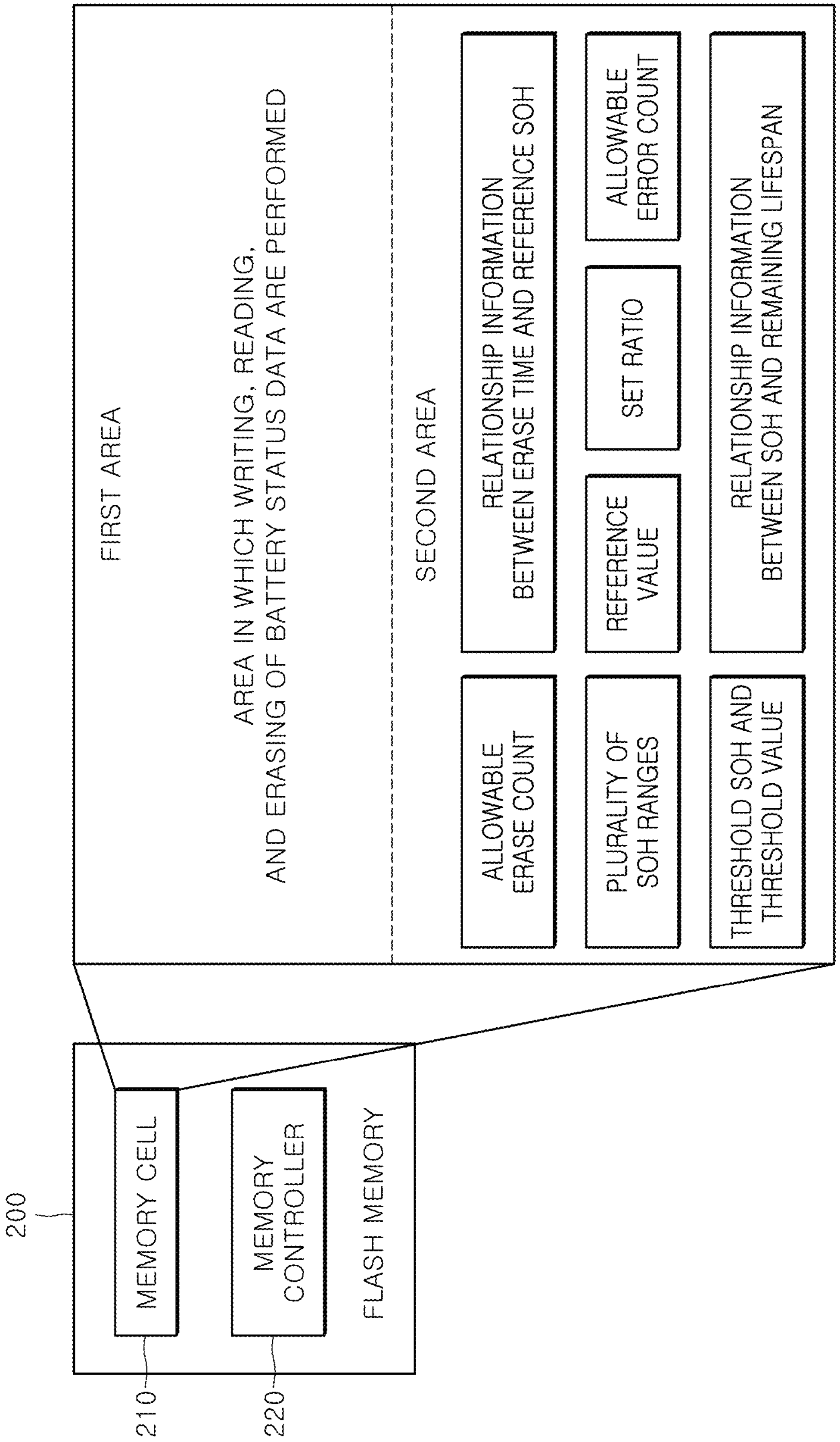
FIG. 2 illustrates an example of a memory cell area of a flash memory of the apparatus for diagnosing a memory according to one embodiment of the present disclosure.
Figure 3:
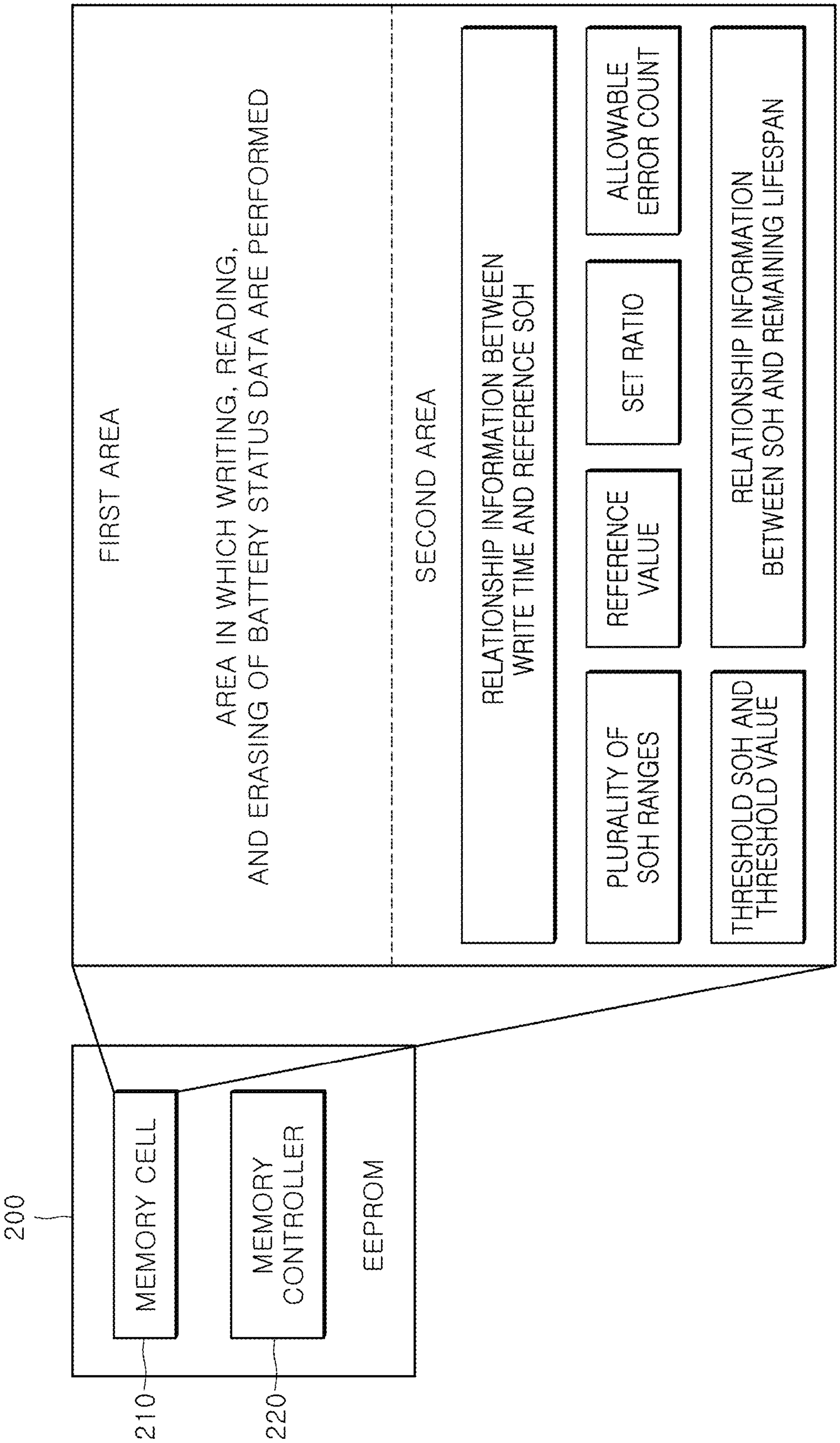
FIG. 3 illustrates an example of a memory cell area of an electrically erasable programmable read-only memory (EEPROM) of the apparatus for diagnosing a memory according to another embodiment of the present disclosure.
Figure 4:
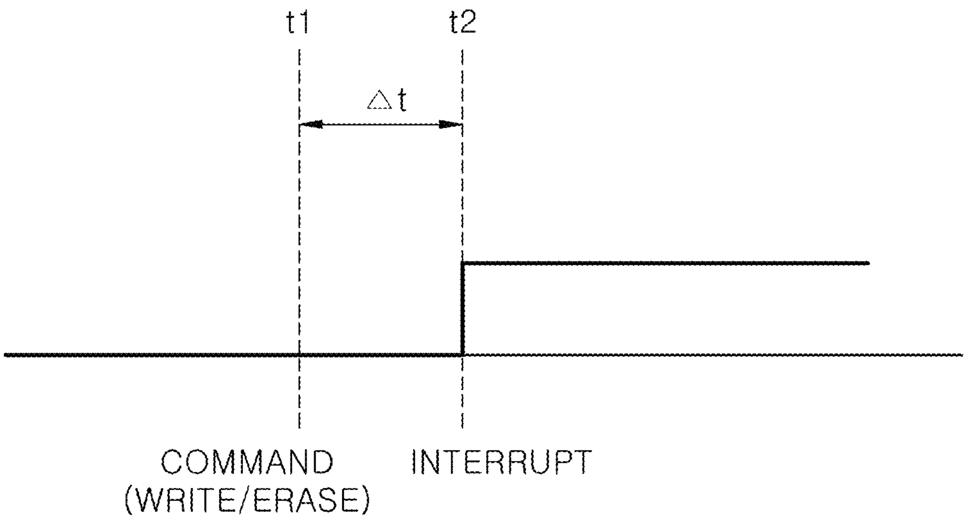
FIG. 4 illustrates an example for describing a process of determining a memory operation state by a higher-level controller in the apparatus for diagnosing a memory according to one embodiment of the present disclosure.

FIG. 1 is a block diagram of an apparatus for diagnosing a memory according to some embodiments of the present disclosure. FIG. 2 is an exemplary diagram illustrating a memory cell area of a flash memory of the apparatus for diagnosing a memory according to one embodiment of the present disclosure. FIG. 3 is an exemplary diagram illustrating the memory cell area of an electrically erasable programmable read-only memory (EEPROM) of the apparatus for diagnosing a memory according to another embodiment of the present disclosure. FIG. 4 is an exemplary diagram for describing a process of determining a memory operation state by a higher-level controller in the apparatus for diagnosing a memory according to one embodiment of the present disclosure.

Referring to FIG. 1, the apparatus for diagnosing a memory of the present embodiments may include a processor 100 and a memory 200.

The processor 100, which is an entity that diagnoses deterioration of the memory 200, may be implemented as a central processing unit (CPU) or a system on chip (SoC). The processor 100 may run an operating system or application to control a plurality of hardware or software components connected to the processor 100 and perform various data processing and computations. The processor 100 may be configured to execute at least one command stored in the memory 200, which will be described below, and store data resulting from the execution in the memory 200.

In the present embodiments, the processor 100 may be implemented as a battery management system (BMS) in a battery pack or as a microcontroller unit (MCU) in the BMS, and as is known in the art, the processor 100 may be configured to detect battery statuses such as current, voltage, open circuit voltage (OCV), and temperature of battery cells. The memory and BMS may constitute a battery pack. Data about the battery statuses detected by the processor 100 may be written to the memory 200 and may be read or erased from the memory 200 as needed. The term "data" expressed in the present embodiments may refer to the battery status data described above.

The memory 200 includes a memory cell 210 to which data can be written, and a memory controller 220 configured to write data to the memory cell 210 and read or erase data written to the memory cell 210 under the control of the processor 100. Accordingly, the processor 100 may function as a higher-level controller that integrally controls writing, reading, and erasing of data to the memory cell 210 through the memory controller 220, and the memory controller 220 may function as a lower-level controller that locally controls writing, reading, and erasing of data to the memory cell 210 under the control of the processor 100. The memory controller may be a processor configured to write data to the memory or erase data written to the memory. A processor may include the memory controller 220 and processor 100 such that the processor is configured to write data to the memory or erase data written to the memory and is configured to diagnose a deterioration of the memory.

In the present embodiments, the memory 200 corresponds to a target whose deterioration is diagnosed by the processor 100, and may be implemented as a non-volatile storage medium, such as a flash memory or an EEPROM. The memory may be a non-transitory computer-readable medium.

FIG. 2 illustrates an example of a memory cell area of a flash memory. The memory cell area of the flash memory may be configured to be divided into first and second areas. The first area corresponds to an area allocated for writing, reading, and erasing the above-described data (e.g., battery status data), and corresponds to a memory cell area, which is a target of the deterioration diagnosis.

The second area corresponds to an area in which at least one instruction executed by and/or for execution by the processor 100 or the memory controller 220 and a plurality of pieces of information required for diagnosing the deterioration of the above-described first area are stored. That is, the processor 100 may be configured to diagnose deterioration of the first area using the information stored in the second area. Table 1 below categorizes and illustrates the information stored in the second area according to purposes.

TABLE 1

| Stored Information | Purpose |
|---|---|
| Allowable erase count | Calculation of first state of health (SOH) |
| Relationship information between erase time and reference SOH | Calculation of second SOH |
| Plurality of SOH ranges according to set steps | Calculation of second SOH |
| Reference value mapped to each SOH range | Calculation of second SOH |
| Set ratio | Calculation of second SOH |
| Allowable error count | Calculation of third SOH |
| Threshold SOH and threshold value | Do not use warning |
| Relationship information between SOH and remaining lifespan | Determination of remaining lifespan |

FIG. 3 illustrates an example of a memory cell area of an EEPROM. The memory cell area of the EEPROM may also be configured to be divided into first and second areas. The first area corresponds to an area allocated for writing, reading, and erasing the above-described data (e.g., battery status data), and corresponds to a memory cell area, which is a target of the deterioration diagnosis.

The second area corresponds to an area in which at least one instruction executed by and/or for execution by the processor 100 or the memory controller 220 and a plurality of pieces of information required for diagnosing the deterioration of the above-described first area are stored. That is, the processor 100 may be configured to diagnose deterioration of the first area using the information stored in the second area. Table 2 below categorizes and illustrates the information stored in the second area according to purposes.

TABLE 2

| Stored Information | Purpose |
|---|---|
| Relationship information between write time and reference SOH | Calculation of fourth SOH |
| Plurality of SOH ranges according to set steps | Calculation of fourth SOH |
| Reference value mapped to each SOH range | Calculation of fourth SOH |
| Set ratio | Calculation of fourth SOH |
| Allowable error count | Calculation of fifth SOH |
| Threshold SOH and threshold value | Do not use warning |
| Relationship information between SOH and remaining lifespan | Determination of remaining lifespan |

Hereinafter, based on the above-described contents, a configuration for diagnosing deterioration of the memory 200 will be described in detail, focusing on an operation of the processor 100.

First, the processor 100 may control an operation of the memory controller 220 and determine an operating state of the memory 200 according to the control result. When determining the operating state of the memory 200, the processor 100 may transmit a command directing erasing or writing of data to the memory cell 210 to the memory controller 220, and may determine the operating state of the memory 200 based on interrupts generated by the memory controller 220.

Referring to FIG. 4, when a command directing erasing or writing of data is transmitted from the processor 100 to the memory controller 220 at a time point t1, and an interrupt generated by the memory controller 220 is transmitted to the processor 100 at a time point t2, the processor 100 may determine a time difference Δt between t1 and t2 as a time required to complete erasing or writing of data (e.g., an erase time or write completion time). The time information determined through the above process functions as a factor considered in calculating an SOH of the memory 200.

The processor 100 may diagnose deterioration of the memory 200 based on one or more of an erase count of data written to the memory cell 210, an erase time required to erase data written to the memory cell 210, a write error count when writing data to the memory cell 210, and a write time required to write data to the memory cell 210, which are determined based on the results of determining the operating state of the memory 200. Two embodiments of specific mechanisms for diagnosing deterioration of the memory 200 may be provided respectively for a case in which the memory 200 is implemented as a flash memory and a case in which the memory 200 is implemented as an EEPROM, and each exemplary embodiment will be described below.

I. Mechanism for Diagnosing Deterioration of Flash Memory

When the memory 200 is implemented as a flash memory, the processor 100 may diagnose deterioration of the memory

200 based on one or more of an erase count of block-level data written to the memory 200 (hereinafter referred to as an "erase count"), an erase time to erase data written to the memory 200 (hereinafter referred to as an "erase time"), and a write error count when writing data to the memory 200 (hereinafter referred to as a "write error count"). The erase count refers to number or count of data that is erased. In the present embodiment, an SOH may be adopted as a parameter for diagnosing deterioration. As can be seen from Table 1 described above, the erase count may be used in a calculation process of a first SOH, the erase time may be used in a calculation process of a second SOH, and the write error count may be used in a calculation process of a third SOH.

First, the processor 100 may calculate the first SOH using a ratio between the erase count and an allowable erase count predefined for the second area of the memory cell 210. The first SOH may be calculated according to Equation 1 below.

$$SOH_1 = 1 - \frac{N_{erose}}{N_{th-errae}} \times 100 \quad \text{(Equation 1)}$$

In Equation 1, $SOH_1$ denotes the first SOH, $N_{erase}$ denotes the erase count, and $N_{th-erase}$ denotes the allowable erase count.

For example, when the erase count is 60 and the allowable erase count is 100, the first SOH may be calculated to be 40%, that is, the first SOH may be calculated to have a smaller value as the erase count increases.

Next, the processor 100 may calculate the second SOH by a method of determining a reference SOH of the memory 200 corresponding to the erase time, specifying a target SOH range to which the reference SOH belongs among a plurality of predefined SOH ranges in the second area of the memory cell 210, and applying a weight to the reference SOH based on the number of times the target SOH range is specified. The reference SOH may be determined from the "relationship information between the erase time and the reference SOH" in Table 1 described above, and corresponds to an SOH that is firstly determined using only the erase time as a factor. That is, the processor 100 may first determine the reference SOH using the erase time, and calculate the second SOH by correcting the determined reference SOH through the weight to be described below. The relationship information between the erase time and the reference SOH may be predefined in such a way that the longer the erase time is, the lower the reference SOH is determined. That is, it may be seen that the longer the erase time is, the higher a degree of deterioration of the memory cell 210 is, so the erase time and the reference SOH may be set to be inversely proportional to each other, and specific numerical values for this may be set to values specified based on the specifications of the memory 200 and designer's experimental results.

In order to determine the weight for correcting the reference SOH, the processor 100 may specify (determine) a target SOH range to which the reference SOH belongs among a plurality of SOH ranges predefined for the second area of the memory cell 210. Table 3 below illustrates an example of the plurality of SOH ranges and a reference value mapped to each SOH range. Table 3 illustrates an example in which each SOH range has a set step of 20%.

TABLE 3

| SOH range | Reference value |
|---|---|
| Greater than or equal to 0% and less than 20% | 600 |
| Greater than or equal to 20% and less than 40% | 800 |

TABLE 3-continued

| SOH range | Reference value |
|---|---|
| Greater than or equal to 40% and less than 60% | 1000 |
| Greater than or equal to 60% and less than or equal to 100% | — |

As a specific example, when the reference SOH is determined to be 55%, the target SOH range to which the reference SOH belongs is determined to be a range greater than or equal to 40% and less than 60%, and the reference value is determined to be 1000. Meanwhile, considering that in the SOH range of 60% to 100%, the deterioration of the memory 200 has not progressed to the extent that the remaining lifespan of the memory 200 is determined, when the reference SOH has a value greater than or equal to 60% and less than or equal to 100%, the calculation operation of the second SOH may be omitted.

The weight may be determined based on the number of times the target SOH range is specified, and specifically, may be determined differentially based on a ratio between the number of times the target SOH range is specified and the reference value mapped to the target SOH range.

When the ratio between the number of times the target SOH range is specified and the reference value mapped to the target SOH range is less than a set ratio (the set ratio may have a value of 1), the weight may be determined by multiplying (i) the ratio between the number of times the target SOH range is specified and the reference value mapped to the target SOH range and (ii) the set step.

In the above-described example, when the number of times a target SOH range greater than or equal to 40% and less than 60% is specified is 100, the ratio between the number of times the target SOH range is specified, which is 100, and a reference value of 1000 is 0.1, and the calculated ratio of 0.1 has a value less than the set ratio of 1, and thus, the weight is determined to be 2, which is the result of multiplying the calculated ratio of 0.1 by the set step of 20.

Once the weight is determined, the processor 100 may calculate the second SOH by subtracting the weight from the reference SOH. In the above-described example, the second SOH is calculated to be a value of 53% by subtracting the weight of 2 from the reference SOH of 55. Following this calculation method, as the number of times the target SOH range is specified increases from the range below the reference value (e.g., as the erase count in the target SOH range increases), the weight increases, and as a result, the second SOH is calculated to be a smaller value.

Meanwhile, when the ratio between the number of times the target SOH range is specified and the reference value is greater than or equal to the set ratio, the weight may be determined as a set margin value (e.g., 1). The set margin value may correspond to a pre-designed/pre-defined value to correct a lower limit SOH of the target SOH range, which will be described below.

In the preceding example, when the number of times a target SOH range of greater than or equal to 40% and less than 60% is specified is 1100, the ratio between the number of times the target SOH range is specified, which is 1100, and the reference value of 1000 is 1.1, and the calculated ratio of 1.1 has a value greater than or equal to the set ratio of 1, and thus, the weight is determined as the set margin value of 1.

Once the weight is determined, the processor 100 may calculate the second SOH by adding the weight to the lower limit SOH of the target SOH range. In the above-described example, the second SOH is calculated to be a value of 41% obtained by adding the set margin value of 1 to the lower limit SOH of the target SOH range, which is 40. That is, when the number of times the target SOH range is specified is greater than or equal to the reference value (when the erase count in the target SOH range is greater than or equal to the reference value), it may be considered that the deterioration of the memory cell 210 has progressed significantly. In consideration of the progressed deterioration of the memory cell 210, in some embodiments, the SOH to be corrected is set as the lower limit SOH of the target SOH range rather than the reference SOH, and then the second SOH is calculated by adding the set lower limit SOH to the predefined set margin value, so that, a topology may be provided in which the second SOH is determined to always have a value that is less than or equal to the value when the ratio between the number of times the target SOH range is specified and the reference value is less than the set ratio.

A formula for calculating the second SOH is summarized as Equation 2 below.

$$SOH_2 = SOH_{ref} - \text{step} \times \frac{N_{target}}{N_{ref}} \quad \text{when } \frac{N_{target}}{N_{ref}} < 1$$
$$SOH_2 = SOH_{lowlimit} + M \quad \text{when } \frac{N_{target}}{N_{ref}} \geq 1 \qquad \text{(Equation 2)}$$

In Equation 2, $SOH_2$ denotes the second SOH, $SOH_{ref}$ denotes the reference SOH, step denotes the set step, $N_{target}$ denotes the number of times the target SOH range is specified, $N_{ref}$ denotes the reference value, $SOH_{lowlimit}$ denotes the lower limit SOH of the target SOH range, and M denotes the set margin value.

Next, the processor 100 may calculate the third SOH using a ratio between the write error count and an allowable error count predefined for the second area of the memory cell 210. The third SOH may be calculated according to Equation 3 below.

$$SOH_3 = 1 - \frac{N_{err-write}}{N_{th-err-write}} \times 100 \qquad \text{(Equation 3)}$$

In Equation 3, $SOH_3$ denotes the third SOH, $N_{err-write}$ denotes the write error count, and $N_{th-err-write}$ denotes the allowable error count.

For example, when the write error count is 60 and the allowable error count is 100, the third SOH may be calculated to be 40%, that is, the third SOH may be calculated to have a smaller value as the write error count increases.

Meanwhile, when a write error occurs, the processor 100 may operate to record an address of the memory cell 210, at which the error occurs, in the second area and write data to be written to the address of another memory cell 210. In this case, the processor 100 may be configured to unconditionally block subsequent writing of data to the address at which an error occurs and which is recorded in the second area. Due to the blocking of data writing to the address at which an error occurs, data write and read operations are prohibited even when the memory cell 210 at the address at which an error occurs is initialized through erase processing.

When the first to third SOHs are calculated, the processor 100 may calculate a final SOH of the memory 200 based on the size of each of the first to third SOHs. In this case, the processor 100 may calculate a minimum value among the first to third SOHs as the final SOH of the memory 200, in consideration of a worst case for deterioration of the memory 200.

Further, when the final SOH calculated as described above is less than or equal to a predefined threshold SOH, or when each of the erase count, the erase time, and the write error count, which are described above, is greater than or equal to a predefined threshold value, the processor 100 may operate to prohibit use of the memory 200 (write, read, and erase), and may also be configured to provide a user with a warning that prohibits use of the memory 200 through a user interface (not illustrated).

II. Mechanism for Diagnosing Deterioration of EEPROM

When the memory 200 is implemented as an EEPROM, the processor 100 may diagnose deterioration of the memory 200 based on one or more of a write time required to write data to the memory 200 (hereinafter referred to as the write time), and a write error count when writing data to the memory 200 (hereinafter referred to as the write error count). As can be seen from Table 2 described above, the write time may be used in a calculation process of a fourth SOH, and the write error count may be used in a calculation process of a fifth SOH.

First, the processor 100 may calculate the fourth SOH by a method of determining a reference SOH of the memory 200 corresponding to the write time, specifying a target SOH range to which the reference SOH belongs among a plurality of predefined SOH ranges in the second area of the memory cell 210, and applying a weight to the reference SOH based on the number of times the target SOH range is specified. The reference SOH may be determined from the "relationship information between the write time and the reference SOH" in Table 2 described above, and corresponds to an SOH that is firstly determined using only the write time as a factor. That is, the processor 100 may first determine the reference SOH using the write time, and calculate the fourth SOH by correcting the determined reference SOH through the weight to be described below. The relationship information between the write time and the reference SOH may be predefined in such a way that the longer the write time is, the lower the reference SOH is determined. That is, it may be seen that the longer the write time is, the higher a degree of deterioration of the memory cell 210 is, so the write time and the reference SOH may be set to be inversely proportional to each other, and specific numerical values therefor may be set to values specified based on the specifications of the memory 200 and designer's experimental results.

In order to determine the weight for correcting the reference SOH, the processor 100 may specify a target SOH range to which the reference SOH belongs among a plurality of SOH ranges predefined for the second area of the memory cell 210. Table 4 below illustrates an example of the plurality of SOH ranges and a reference value mapped to each SOH range. Table 4 illustrates an example in which each SOH range has a set step of 20%.

TABLE 4

| SOH range | Reference value |
|---|---|
| Greater than or equal to 0% and less than 20% | 600 |

TABLE 4-continued

| SOH range | Reference value |
|---|---|
| Greater than or equal to 20% and less than 40% | 800 |
| Greater than or equal to 40% and less than 60% | 1000 |
| Greater than or equal to 60% and less than or equal to 100% | — |

As a specific example, when the reference SOH is determined to be 55%, the target SOH range to which the reference SOH belongs is determined to be a range greater than or equal to 40% and less than 60%, and the reference value is determined to be 1000. Meanwhile, considering that in the SOH range of 60% to 100%, the deterioration of the memory 200 has not progressed to the extent that the remaining lifespan of the memory 200 is determined, when the reference SOH has a value greater than or equal to 60% and less than or equal to 100%, the calculation operation of the fourth SOH may be omitted.

The weight may be determined based on the number of times the target SOH range is specified, and specifically, may be determined differentially based on a ratio between the number of times the target SOH range is specified and the reference value mapped to the target SOH range.

When the ratio between the number of times the target SOH range is specified and the reference value mapped to the target SOH range is less than a set ratio (the set ratio may have a value of 1), the weight may be determined by multiplying (i) the ratio between the number of times the target SOH range is specified and the reference value mapped to the target SOH range and (ii) the set step.

In the above-described example, when the number of times a target SOH range greater than or equal to 40% and less than 60% is specified is 100, the ratio between the number of times the target SOH range is specified, which is 100, and a reference value of 1000 is 0.1, and the calculated ratio of 0.1 has a value less than the set ratio of 1, and thus, the weight is determined to be 2, which is the result of multiplying the calculated ratio of 0.1 by the set step of 20.

Once the weight is determined, the processor 100 may calculate the fourth SOH by subtracting the weight from the reference SOH. In the above-described example, the fourth SOH is calculated to be a value of 53% by subtracting the weight of 2 from the reference SOH of 55. Following this calculation method, as the number of times the target SOH range is specified increases from the range below the reference value (e.g., as the write count in the target SOH range increases), the weight increases, and as a result, the fourth SOH is calculated to be a smaller value.

Meanwhile, when the ratio between the number of times the target SOH range is specified and the reference value is greater than or equal to the set ratio, the weight may be determined as a set margin value (e.g., 1). The set margin value may correspond to a pre-designed value to correct a lower limit SOH of the target SOH range, which will be described below.

In the preceding example, when the number of times a target SOH range of greater than or equal to 40% and less than 60% is specified is 1100, the ratio between the number of times the target SOH range is specified, which is 1100, and the reference value of 1000 is 1.1, and the calculated ratio of 1.1 has a value greater than or equal to the set ratio of 1, and thus, the weight is determined as the set margin value of 1.

Once the weight is determined, the processor 100 may calculate the fourth SOH by adding the weight to the lower limit SOH of the target SOH range. In the above-described example, the fourth SOH is calculated to be a value of 41% obtained by adding the set margin value of 1 to the lower limit SOH of the target SOH range, which is 40. That is, when the number of times the target SOH range is specified is greater than or equal to the reference value (when the write count in the target SOH range is greater than or equal to the reference value), it may be considered that the deterioration of the memory cell 210 has progressed significantly. In consideration of the progressed deterioration of the memory cell 210, in some embodiments, the SOH to be corrected is set as the lower limit SOH of the target SOH range rather than the reference SOH, and then the fourth SOH is calculated by adding the set lower limit SOH to the predefined set margin value, so that, a topology may be provided in which the fourth SOH is determined to always have a value that is less than or equal to the value when the ratio between the number of times the target SOH range is specified and the reference value is less than the set ratio.

A formula for calculating the fourth SOH is summarized as Equation 4 below.

$$SOH_4 = SOH_{ref} - \text{step} \times \frac{N_{target}}{N_{ref}} \quad \text{when } \frac{N_{target}}{N_{ref}} < 1$$
$$SOH_4 = SOH_{lowlimit} + M \quad \text{when } \frac{N_{target}}{N_{ref}} \geq 1 \qquad \text{(Equation 4)}$$

In Equation 4, $SOH_4$ denotes the fourth SOH, $SOH_{ref}$ denotes the reference SOH, step denotes the set step, $N_{target}$ denotes the number of times the target SOH range is specified, $N_{ref}$ denotes the reference value, $SOH_{lowlimit}$ denotes the lower limit SOH of the target SOH range, and M denotes the set margin value.

Next, the processor 100 may calculate the fifth SOH using a ratio between the write error count and an allowable error count predefined for the second area of the memory cell 210. The fifth SOH may be calculated according to Equation 5 below.

$$SOH_5 = 1 - \frac{N_{err-write}}{N_{th-err-write}} \times 100 \qquad \text{(Equation 5)}$$

In Equation 5, $SOH_5$ denotes the fifth SOH, $N_{err-write}$ denotes the write error count, and $N_{th-err-write}$ denotes the allowable error count.

For example, when the write error count is 60 and the allowable error count is 100, the fifth SOH may be calculated to be 40%, that is, the fifth SOH may be calculated to have a smaller value as the write error count increases.

Meanwhile, when a write error occurs, the processor 100 may be allocated a spare address converted from an address at which the error occurs and may perform a data write operation using the allocated spare address. That is, since an EEPROM may have a built-in function to convert an address of a specific memory cell 210 to a spare space address, the processor 100 may perform the data write operation to the spare address converted by the above function. Data writing to the address at which an error occurs may be blocked, and thus, data write and read operations are prohibited even when the memory cell 210 at the address at which an error occurs is initialized through erase processing.

Once the fourth and fifth SOHs are calculated, the processor 100 may calculate a final SOH of the memory 200 based on the size of each of the fourth and fifth SOHs. In this case, the processor 100 may calculate a minimum value among the fourth and fifth SOHs as the final SOH of the memory 200, in consideration of a worst case for deterioration of the memory 200.

Further, when the final SOH calculated as described above is less than or equal to a predefined threshold SOH, or when each of the write time and the write error count, which are described above, is greater than or equal to a predefined threshold value, the processor 100 may operate to prohibit use of the memory 200 (write, read, and erase) and may also be configured to provide a user with a warning that prohibits use of the memory 200 through user interface (not illustrated).

When the final SOH is calculated for the flash memory or EEPROM, the processor 100 may determine the remaining lifespan of the memory 200 corresponding to the final SOH. In this case, a method of extracting the remaining lifespan corresponding to the final SOH from relationship information between the predefined SOH and the remaining lifespan may be applied. The relationship information between the SOH and the remaining lifespan may be predefined based on the specifications of the memory 200 and designer's experimental results.

In addition, the processor 100 may record the final SOH and the remaining lifespan in the second area of the memory cell 210, and may also be configured to transmit deterioration diagnosis results (e.g., the final SOH and the remaining lifespan) stored in the memory 200 to the outside in response to a request for transmission of diagnostic information for the memory 200, which is received from the outside (e.g., an external device). In this case, an embodiment may be provided in which a request for transmission of diagnostic information including an authentication key from a separately provided external device is transmitted to the processor 100, and only when an authentication key previously stored/predefined in the second area of the memory cell 210 matches the authentication key included in the currently received request for transmission of diagnostic information (e.g., is authenticated), the final SOH and the remaining lifespan are read from the memory 200 and transmitted to the external device, by the processor 100.

Figure 5:
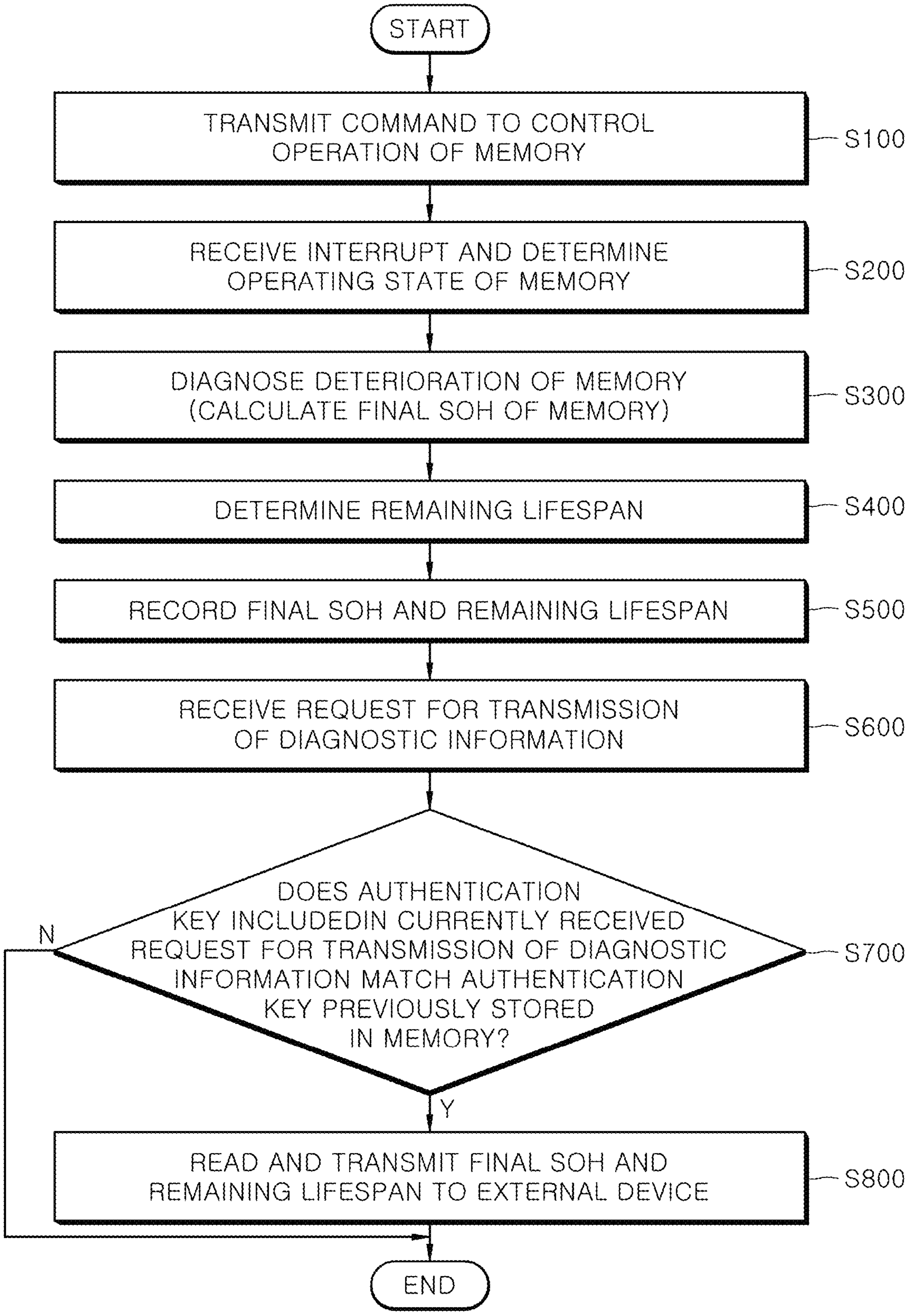
FIGS. 5 to 7 are flowcharts of methods of diagnosing a memory according to at least one embodiment of the present disclosure.
Figure 6:
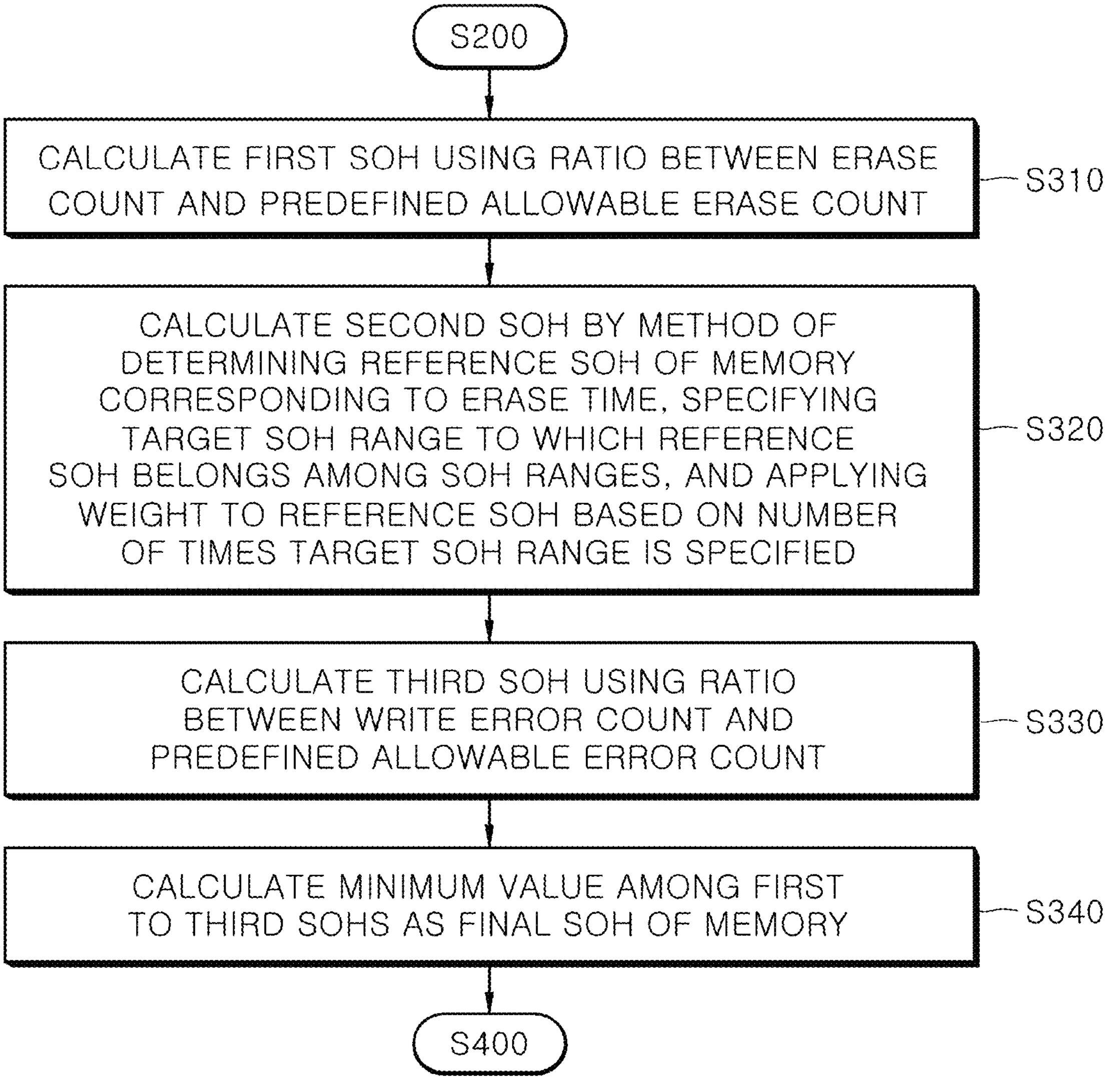
Figure 7:
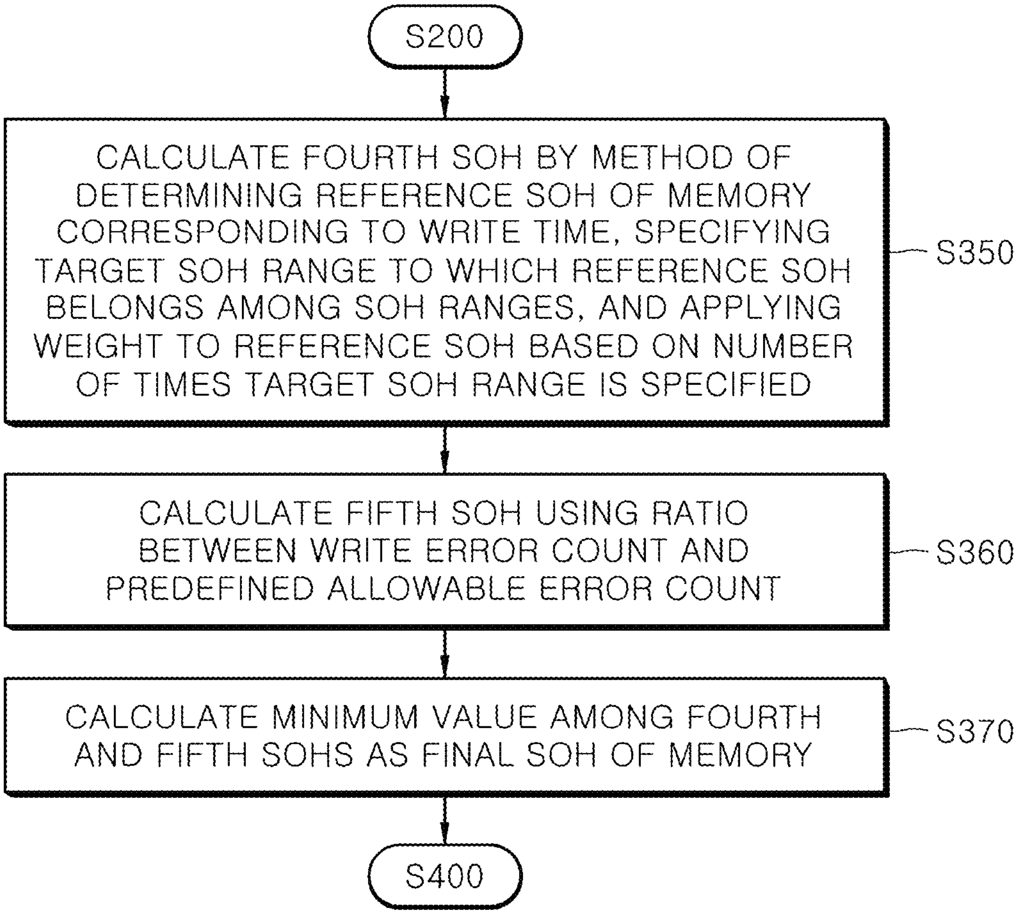

FIG. 5 is a flowchart of a method of diagnosing a memory according to at least one embodiment of the present disclosure. FIG. 6 is a flowchart of a method of diagnosing a memory according to at least one embodiment of the present disclosure. FIG. 7 is a flowchart of a method of diagnosing a memory according to at least one embodiment of the present disclosure. The methods of diagnosing a memory according to the present embodiments will be described with reference to FIGS. 5 to 7, and a detailed description of parts overlapping with the aforementioned contents will be omitted, and the description will be made focusing on a time series configuration.

First, the processor 100 (e.g., a higher-level controller) transmits a command to control an operation of the memory 200 to the memory controller 220 (operation S100), and determines an operating state of the memory 200 based on interrupts generated by the memory controller 220 (operation S200).

Subsequently, the processor 100 may diagnose deterioration of the memory 200 based on one or more of an erase count of data written to the memory cell 210, an erase time required to erase data written to the memory cell 210, a write error count when writing data to the memory cell 210, and a write time required to write data to the memory cell 210, which are determined/identified based on the result of determining the operating state of the memory 200 (operation S300).

With reference to FIG. 6, when operations in operation S300, which are performed when the memory 200 is implemented as a flash memory, as shown, the processor 100 calculates a first SOH using a ratio between the erase count and a predefined allowable erase count (operation S310).

In addition, the processor 100 calculates a second SOH by a method of determining a reference SOH of the memory 200 corresponding to the erase time, specifying a target SOH range to which the reference SOH belongs among a plurality of SOH ranges, and applying a weight to the reference SOH based on the number of times the target SOH range is specified (operation S320). The reference SOH is determined to have a lower value as the erase time increases.

In operation (act) S320, the weight is differentially determined according to a ratio between the number of times the target SOH range is specified and a reference value mapped to the target SOH range. Specifically, when the ratio between the number of times the target SOH range is specified and the reference value mapped to the target SOH range is less than a set ratio, the weight is determined by multiplying (i) the ratio between the number of times the target SOH range is specified and the reference value mapped to the target SOH range, and (ii) a set step, and the processor 100 calculates the second SOH by subtracting the weight from the reference SOH. When the ratio between the number of times the target SOH range is specified and the reference value mapped to the target SOH range is greater than or equal to the set ratio, the weight is determined as a set margin value, and the processor 100 adds the set margin value to a lower limit SOH of the target SOH range to calculate the second SOH.

In addition, the processor 100 calculates a third SOH using a ratio between the write error count and a predefined allowable error count (operation S330).

Operations S310 to S330 may be independently performed, and the execution order thereof is not limited to the order described above.

When the first to third SOHs are calculated through operations S310 to S330, the processor 100 may calculate a minimum value among the first to third SOHs as a final SOH of the memory 200 (operation S340).

With reference to FIG. 7, when operations in operation S300, which are performed when the memory 200 is implemented as an EEPROM, as shown, the processor 100 calculates a fourth SOH by a method of determining a reference SOH of the memory 200 corresponding to the write time, specifying a target SOH range to which the reference SOH belongs among a plurality of SOH ranges, and applying a weight to the reference SOH based on the number of times the target SOH range is specified (operation S350). The reference SOH is determined to have a lower value as the write time increases.

In operation S350, the weight is differentially determined according to a ratio between the number of times the target SOH range is specified and a reference value mapped to the target SOH range. Specifically, when the ratio between the number of times the target SOH range is specified and the reference value mapped to the target SOH range is less than a set ratio, the weight is determined by multiplying (i) the ratio between the number of times the target SOH range is specified and the reference value mapped to the target SOH range, and (ii) a set step, and the processor 100 calculates the fourth SOH by subtracting the weight from the reference SOH. When the ratio between the number of times the target SOH range is specified and the reference value mapped to the target SOH range is greater than or equal to the set ratio, the weight is determined as a set margin value, and the processor 100 adds the set margin value to a lower limit SOH of the target SOH range to calculate the fourth SOH.

In addition, the processor 100 calculates a fifth SOH using a ratio between the write error count and a predefined allowable error count (operation S360).

Operations S350 to S360 may be independently performed, and the execution order thereof is not limited to the order described above.

When the fourth and fifth SOHs are calculated through operations S350 and S360, the processor 100 calculates a minimum value among the fourth and fifth SOHs as a final SOH of the memory 200 (operation S370).

When the final SOH is calculated through operation S300, the processor 100 determines the remaining lifespan corresponding to the final SOH using relationship information between the predefined SOH and the remaining lifespan (operation S400).

Subsequently, referring to FIG. 5, the processor 100 records the final SOH and the remaining lifespan of the memory 200 in the memory 200 (operation S500).

Thereafter, when a request for transmission of diagnostic information including an authentication key from an external device is received (operation S600), the processor 100 compares an authentication key previously stored in the memory 200 with the authentication key included in the currently received request for transmission of diagnostic information (operation S700), and only when the two authentication keys match each other, the final SOH and the remaining lifespan are read from the memory 200 and transmitted to the external device (operation S800).

As described above, according to the present disclosure, a quantitative lifespan management topology for a memory constituting a battery pack may be provided by adopting a method of calculating an SOH of the memory and determining the remaining lifespan based on one or more of an erase count of data written to the memory, an erase time required to erase data written to the memory, a write error count when writing data to the memory, and a write time required to write data to a memory cell.

The embodiments described herein may be implemented, for example, as a method or process, a device, a software program, a data stream, or a signal. Although discussed in the context of a single type of implementation (for example, discussed only as a method), features discussed herein may also be implemented in other forms (for example, a device or a program). The device may be implemented by suitable hardware, software, firmware, and the like. The method may be implemented on a device, such as a processor that generally refers to a processing device including a computer, a microprocessor, an integrated circuit, a programmable logic device, etc. The processor includes a communication device such as a computer, a cell phone, a personal digital assistant (PDA), and other devices that facilitate communication of information between the device and end-users.

According to the present disclosure, a quantitative lifespan management topology for a memory constituting a battery pack can be provided by adopting a method of calculating a state of health (SOH) of the memory and determining the remaining lifespan according to the SOH based on one or more of an erase count of data written to the memory, an erase time required to erase data written to the memory, a write error count when writing data to the memory, and a write time required to write data to a memory cell.

However, effects that can be achieved through the present disclosure are not limited to the above-described effects and other effects that are not described may be clearly understood by those skilled in the art from the detailed descriptions.

Although the present disclosure has been described with reference to embodiments and drawings illustrating aspects thereof, the present disclosure is not limited thereto. Various modifications and variations can be made by a person skilled in the art to which the present disclosure belongs within the scope of the technical spirit of the present disclosure and the claims and their equivalents, below.

What is claimed is:

1. An apparatus for diagnosing a memory, the apparatus comprising:

the memory; and a processor configured to write data to the memory or erase data written to the memory, wherein the processor is configured to diagnose a deterioration of the memory based on one or more of an erase count of the data written to the memory, an erase time required to erase the data written to the memory, and a write error count when writing the data to the memory, and wherein the processor is configured to calculate a first state of health (SOH), a second SOH, and a third SOH of the memory based on the erase count, the erase time, and the write error count, and is configured to calculate a final SOH of the memory based on a size of each of the calculated first to third SOHs.

2. The apparatus of claim 1, wherein the processor is configured to calculate the first SOH using a ratio between the erase count and a predefined allowable erase count.

3. The apparatus of claim 1, wherein a plurality of SOH ranges are predefined according to a set step, and wherein the processor is configured to calculate the second SOH by a method of determining a reference SOH of the memory corresponding to the erase time, specifying a target SOH range to which the reference SOH belongs among the plurality of SOH ranges, and applying a weight to the reference SOH based on a number of times the target SOH range is specified.

4. The apparatus of claim 3, wherein the weight is differentially determined according to a ratio between the number of times the target SOH range is specified and a reference value mapped to the target SOH range.

5. The apparatus of claim 4, wherein when the ratio between the number of times the target SOH range is specified and the reference value mapped to the target SOH range is less than a set ratio:

the weight is determined by multiplying (i) the ratio between the number of times the target SOH range is specified and the reference value mapped to the target SOH range and (ii) the set step, and the processor calculates the second SOH by subtracting the weight from the reference SOH.

6. The apparatus of claim 4, wherein when the ratio between the number of times the target SOH range is specified and the reference value mapped to the target SOH range is greater than or equal to a set ratio:

the weight is determined as a set margin value, and the processor calculates the second SOH by adding the set margin value to a lower limit SOH of the target SOH range.

7. The apparatus of claim 3, wherein the reference SOH is determined to have a lower value as the erase time increases.

8. The apparatus of claim 1, wherein the processor is configured to calculate the third SOH using a ratio between the write error count and a predefined allowable error count.

9. The apparatus of claim 1, wherein the processor is configured to calculate a minimum value among the first to third SOHs as the final SOH of the memory.

10. The apparatus of claim 1, wherein the processor is configured to diagnose the deterioration of the memory by further considering a write time required to write the data to the memory.

11. The apparatus of claim 10, wherein the processor is configured to calculate a fourth SOH and a fifth SOH of the memory based on the write time and the write error count, and calculates the final SOH of the memory based on a size of each of the calculated fourth and fifth SOHs.

12. The apparatus of claim 11, wherein:

a plurality of SOH ranges are predefined according to a set step, and the processor is configured to calculate the fourth SOH by a method of determining a reference SOH of the memory corresponding to the write time, specifying a target SOH range to which the reference SOH belongs among the plurality of SOH ranges, and applying a weight to the reference SOH based on a number of times the target SOH range is specified.

13. The apparatus of claim 1, wherein:

the memory includes a flash memory, and when an error occurs when writing data to the flash memory, the processor unconditionally blocks subsequent writing of data to an address at which the error occurs.

14. The apparatus of claim 1, wherein:

the memory includes an electrically erasable programmable read-only memory (EEPROM), and when an error occurs when writing data to the EEPROM, the processor is allocated a spare address converted from an address at which the error occurs, and the processor performs a data write operation using the allocated spare address.

15. The apparatus of claim 1, wherein the processor transmits a deterioration diagnosis result for the memory to an external device only when a currently received request for transmission of diagnostic information is authenticated by a predefined authentication key.

16. An apparatus for diagnosing a memory, the apparatus comprising:

the memory including:

a memory cell, and a memory controller that is configured to write data to the memory cell or erase data written to the memory cell; and a higher-level controller configured to control an operation of the memory and determine an operating state according to a control result, wherein the higher-level controller is configured to diagnose a deterioration of the memory based on one or more of an erase count of the data written to the memory cell, an erase time required to erase the data written to the memory cell, a write error count when writing the data to the memory cell, and a write time required to write the data to the memory cell, which are identified based on a result of determining the operating state of the memory.

17. The apparatus of claim 16, wherein the higher-level controller is configured to transmit a command directing erasing or writing of the data to the memory cell to the memory controller and is configured to determine the operating state of the memory based on an interrupt generated by the memory controller.

18. The apparatus of claim 16, wherein the higher-level controller is implemented as a battery management system (BMS), and wherein the memory and the BMS constitute a battery pack.

19. A method of diagnosing deterioration of a memory including a memory cell and a memory controller configured to write data to the memory cell or erase the data written to the memory cell, the method comprising:

transmitting, by a higher-level controller, a command to control an operation of the memory to the memory controller;

determining, by the higher-level controller, an operating state of the memory based on an interrupt generated by the memory controller; and diagnosing, by the higher-level controller, the deterioration of the memory based on one or more of an erase count of the data written to the memory cell, an erase time required to erase the data written to the memory cell, a write error count when writing the data to the memory cell, and a write time required to write the data to the memory cell, which are identified based on a result of determining the operating state of the memory.

* * * * *